United States Patent [19]

Soiferman

[11] Patent Number: 5,424,633
[45] Date of Patent: Jun. 13, 1995

[54] CONTACTLESS TEST METHOD AND SYSTEM FOR TESTING PRINTED CIRCUIT BOARDS

[75] Inventor: Jacob Soiferman, Winnipeg, Canada
[73] Assignee: Advanced Test Technologies Inc., Weyburn, Canada
[21] Appl. No.: 953,845
[22] Filed: Sep. 30, 1992

Related U.S. Application Data

[63] Continuation-in-part of Ser. No. 860,069, Mar. 30, 1992, Pat. No. 5,218,294, which is a continuation of Ser. No. 643,356, Jan. 22, 1991, abandoned.
[51] Int. Cl.$^6$ .................. G01R 31/02; H01H 31/04
[52] U.S. Cl. .................. 324/158.1; 324/538; 324/639
[58] Field of Search ............ 324/158 R, 158 F, 73.1, 324/501, 439, 537, 538, 639, 642, 655, 675, 519, 158.1

[56] References Cited

U.S. PATENT DOCUMENTS

| | | | |
|---|---|---|---|
| 3,327,212 | 6/1967 | Taub et al. | 324/95 |
| 4,507,605 | 3/1985 | Geisel | 324/501 |
| 4,552,151 | 11/1985 | Bolomey et al. | 324/639 |
| 4,583,042 | 4/1986 | Riemer | 324/519 |
| 4,631,473 | 12/1986 | Honda | 324/95 |
| 4,700,127 | 10/1987 | Sasaki et al. | 324/642 |
| 4,704,614 | 11/1987 | Poirier et al. | 324/95 |
| 4,719,883 | 3/1973 | Pentecost | 336/212 |
| 4,771,230 | 9/1988 | Zeh | 324/459 |
| 4,805,627 | 2/1989 | Klingenbeck et al. | 324/639 |
| 4,829,238 | 5/1989 | Goulette et al. | 324/158 F |
| 4,833,396 | 5/1989 | Haberland | 324/655 |
| 5,006,788 | 9/1991 | Goulette et al. | 324/501 |
| 5,124,660 | 6/1992 | Cilingiroglu | 324/538 |
| 5,128,621 | 7/1992 | Berthaud et al. | 324/639 |

FOREIGN PATENT DOCUMENTS 239251 9/1987 European Pat. Off.

OTHER PUBLICATIONS

Z. A. Delecki, M. Barakat, M. Pawlak, L. Shafai and J. Soiferman. Near field receiving properties of printed loop antennas. In Proceedings of the Canadian Conference on Electrial and Computer Engineering, vol. 2, pp. 1106–1108, Montreal, P.Q. Canada. Sep. 17–20, 1989.
Z. A. Delecki and M. Barakat. Contactless test system fo printed circuit boards. In Bulletin of Division of Electrical Engineering, vol. 3, No.: 4, NRCC, Ottawa, Canada. May 1990.
Z. A. Delecki, M. Barakat, J. Soiferman and Y. Yan. Electromagnetic reactive field imaging of printed circuit boards. In Symposium on Antenna Techology and Applied Electromagnetics, pp. 777–783. Winnipeg, Canada. Aug. 15–17, 1990.
Z. A. Delecki and M. Barakat. Equivalent circuit of small receiving antennas in near field. In Proceedings of the Symposium on Antenna Technology and Applied Electromagnetics, pp. 772–776. Winnipeg, Canada. Aug. 1990.
Z. A. Delecki, J. Soiferman and Y. Yan. Application of electromagnetic imaging in industrial testing. In Proceedings of Canadian Conference on Electrical Computer Engineering, vol. 2, Quebec, Quebec, Canada. Sep. 25–27, 1991.
K. Adamiak and Z. A. Delecki. Electromagnetic identification of strip coordinates of printed circuit boards. 1992.

*Primary Examiner*—Ernest F. Karlsen
*Attorney, Agent, or Firm*—Adrian D. Battison; Stanley G. Ade; Murray E. Thrift

[57] ABSTRACT

This application describes a method of testing for manufacturing faults and quality of unpopulated or inactive populated electronic printed circuit boards (PCB). This method can be used to develop a new contactless test system (CTS). An electromagnetic field is generated by an energizing plate connected to an AC signal. When a board under test (BUT) is placed within the electromagnetic field, perturbation of the original field by conducting elements on the BUT is solely a function of the geometrical layout of the conducting elements on the BUT. Therefore, measurement of the perturbed electromagnetic field produces a characteristic pattern for the BUT. Such a pattern can then be compared to a known pattern for the same type of board to determine whether the BUT is faulty (shorts or opens) or not faulty. The most distinctive feature of this method is that testing PCBs by this method requires no electrical contact with the BUT due to the use of the energizing plate.

14 Claims, 4 Drawing Sheets

CONTACTLESS TEST METHOD AND SYSTEM FOR TESTING PRINTED CIRCUIT BOARDS

TECHNICAL FIELD

This application is a continuation-in-part of application Ser. No. 860,069, filed Mar. 30, 1992, U.S. Pat. No. 5,218,294, which is a continuation application of application Ser. No. 643,356, filed Jan. 22, 1991, now abandoned.

This invention is in the general field of test and measurement of the quality, shape, and/or dimensions of conducting paths, pads, traces, and electronic components formed or placed on the surface or on intermediate layers of a printed circuit board (PCB), ceramic substrate, or like items.

This invention makes available a contactless method and system for the automatic testing for manufacturing faults and quality of unpopulated or inactive populated electronic printed circuit boards. The manufacturing faults are unwanted shorts and opens on the board under test. The manufacturing quality includes the mechanical tolerances of conducting elements on the board under test.

BACKGROUND PRIOR ART

During the manufacture or subsequent handling of PCBs, defects such as discontinuities (cracks) or unwanted continuities (shorts) may develop in or between circuit pathways and electronic components. It is necessary to do automated testing of PCBs both for manufacturing and maintenance purposes.

Testing of PCBs is becoming increasingly difficult and more expensive as the use of surface mount technology increases and as integrated circuits and PCBs become more complex and operate at higher frequencies. Conventional techniques for automated PCB testing are based on the idea of applying signals through a set of test pins and measuring output signals at other test pins. This method requires tight mechanical tolerances for the board layout, easily accessible test points, and restricts the frequency band at which a board can be tested (most of the test systems are limited to 100 MHz). The novel method presented here does not have these constraints because of its contactless nature. Another factor separating existing test techniques from this invention, is the contactless test system universality. The CTS does not need the custom setup of test pins and test patterns for the BUT, which make presently used test systems expensive and inaccessible to some complex circuit boards. Therefore, the applied CTS offers substantial advantages over existing test methods which utilize electrical contact.

Non-contact probes have been used for; measurements on high frequency microwave circuits. However, at frequencies below 1 GHz, the test is difficult due to the high bandwidth of the probes. Most recent advances of the test equipment industry have resulted in devices for the evaluation of electromagnetic compatibility (EMC) of PCB assemblies. However, these devices, in their present forms, provide only information about electromagnetic interference caused by the BUT, and can not be used for providing detailed information about the performance of the BUT. This invention is targeted at measuring detailed EMF for testing the quality of the BUT.

The previous patent by Goulette et at. (U.S. Pat. No. 5,006,788) described a similar method as that in this patent. But, the distinction between this patent and the previous one can be easily seen as follows. In the previous patent, in order to test a whole board, all the circuits or conducting elements on the board have to be connected to AC signal sources, therefore emitting the wanted electromagnetic field. To connect all the circuits (or conducting elements) on the board to active AC signals in the Goulette method is absolutely dependent on the circuit layout on the board and requires a specific complex connection setup for testing a whole board. Therefore, the testing method is not universal for testing all types of boards and may be only suitable for testing small, local areas of the board rather than a whole board.

The invention described here provides an universal and contactless method of testing for manufacturing faults and quality of any type of unpopulated or inactive populated printed circuit boards due to the use of the energizing plate. This method does not require any electrical contact with the BUT or a special test setup dependent on the board design layout, both of which are required by the previous invention.

SUMMARY OF INVENTION

This present invention provides a contactless method of testing for manufacturing faults and quality of unpopulated or inactive populated printed circuit boards. The manufacturing faults are unwanted shorts and opens on the board under test. The manufacturing quality includes the mechanical tolerances of conducting elements (conducting paths, pads, traces, vias, and electronic components) on the board under test.

An electromagnetic field is generated by an energizing plate connected to an AC signal. When a board under test (BUT) is placed within the electromagnetic field, perturbation of the original field by conducting elements on the BUT is solely a function of the geometrical layout of conducting elements on the BUT. Therefore, measurement of the perturbed electromagnetic field produces a characteristic pattern for the BUT. Such a pattern can then be compared to a known pattern for the same type of board to determine whether the BUT is faulty or not faulty.

The above described method provides a new contactless test system (CTS). The CTS consists of an energizing metal plate, an AC signal generator, suitable electromagnetic sensors, a sensor control unit, a measurement unit, a central computer workstation, and a board fixture onto which the BUT is mounted. The energizing metal plate is connected to an AC signal generator. One side of the plate must have an insulation layer to prevent electrical shorting with the BUT. The AC signal generator generates a sinusoidal signal at a single frequency into the energizing plate which then emits an electromagnetic field onto the BUT at the same frequency. The insulated side of the energizing plate is placed on top of the BUT. The electromagnetic sensors can be in the form of a full size array covering the whole BUT or a smaller size array movable to scan the whole BUT. The sensor is placed in close proximity to the other side (the side without the energizing plate) of the BUT. There must also be an insulation layer between the sensor board and the BUT. The sensor control unit controls the movement of sensors (sensor array) and switches the detected signals to the measurement unit. The measurement and signal processing device can be a spectrum analyzer or other custom designed circuits capable of measuring peak values of the detected signals and producing data in digital form. The central computer workstation controls the whole system by commanding the sensor control unit, receiving the measured results from the measurement unit, and running the fault recognition procedure.

In the above described system, the electromagnetic field emitted from the energizing plate is evenly distributed onto the whole BUT. There is no electrical contact with the BUT from the energizing plate. The application of the field is completely independent from the design layout of conducting elements on the BUT. These features make the test method universally applicable to testing any type of boards contactlessly. The field perturbation by the BUT is solely a function of the design layout of the BUT. Therefore, the electromagnetic field signal detected by each sensor represents a pattern of the BUT at a particular XY coordinate where the sensor is located. The signal detected by each sensor is processed by the measurement unit to produce a peak value of the signal in a digital form. The resultant data from each sensor over all locations of the BUT constitutes a pattern (one scan) for the whole board. The fault recognition system compares the pattern of the BUT with a known or desired pattern of an identical, non-faulty board. Such comparisons result in a measure of the difference between the non-faulty and faulty boards. If the difference is larger than a pre-determined threshold, the BUT is diagnosed to be faulty or out of tolerance. If the difference is smaller than the threshold, the BUT is diagnosed to be non-faulty. Statistical analysis can further result in more detailed information of faults found, such as location, type, etc. The so called "known pattern" of the non-faulty board can be obtained either by scanning a non-faulty board in the same way as scanning the BUT, or by theoretical calculation according to the design specification. A paper relating to theoretical calculation of the emissions is attached to this specification in Schedule A.

Thus firstly a known standard of an unpopulated circuit board having a required structure and a required function is selected and a signal is applied to the sample arrangement, the signal being independent of the predetermined function of the circuit board. The electromagnetic near-field distribution generated by the sample is then detected using an array of non-contact sensors and the array is used to create a sample pattern representative of the electromagnetic near-field distribution sample arrangement. Subsequently the near-field distribution of a test arrangement is similarly detected and a pattern created therefrom. A comparison is then made between the sample pattern and the test pattern to determine whether the test arrangement is in conformance with the known standard.

The term unpopulated circuit board is intended herein to comprise a circuit board prior to the application thereof of the electronic components. The term inactive populated circuit board refers to a circuit board on which the electronic components have been applied but in which the board is disconnected from any electrical supplies relating to the powering of input signals to the board.

BRIEF DESCRIPTION OF THE DRAWINGS

The following figures accompany this application to provide a better understanding of the concept of this invention. They reflect implementation aspects of this invention. Each of the figures is identified by a reference character, and wherein.

IMPLEMENTING THE INVENTION

Figure 1:
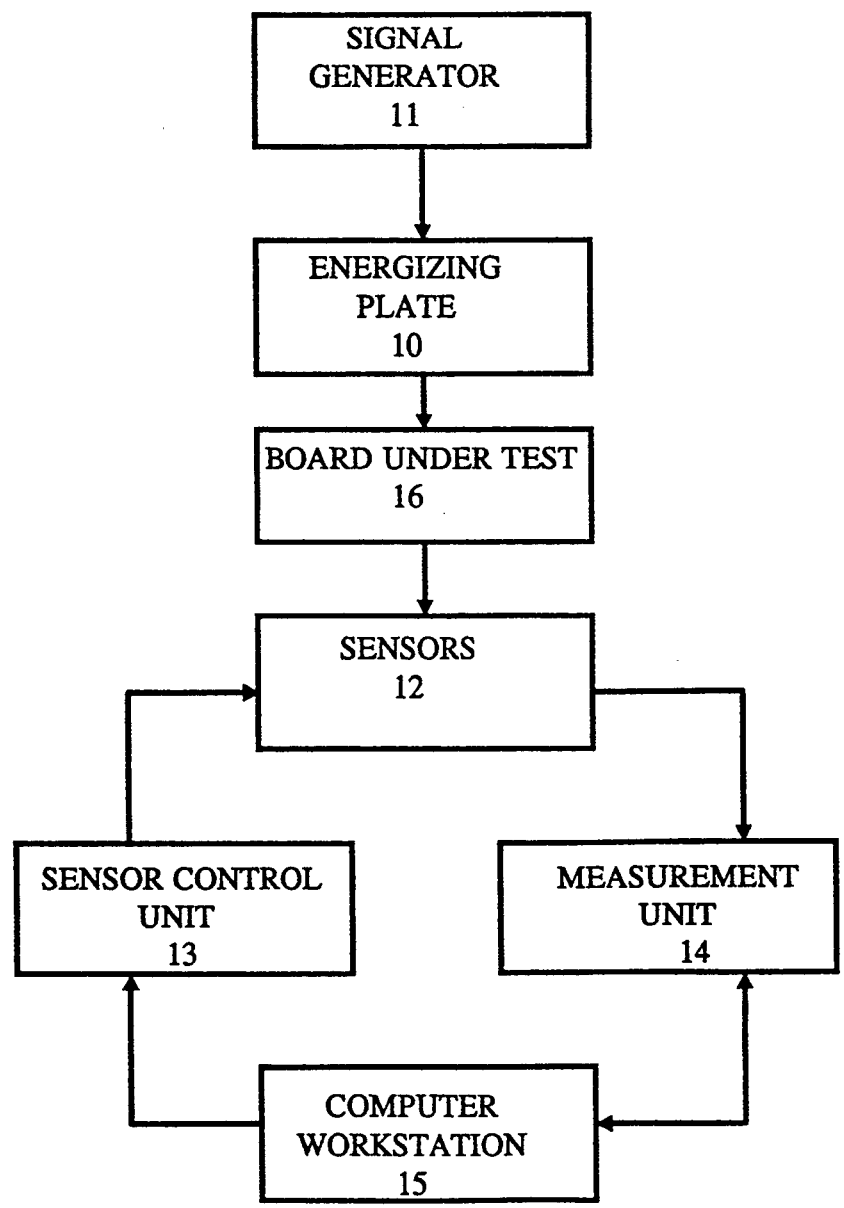
FIG. 1 is the hardware architecture of the CTS, illustrating hardware components of the implemented system and their interrelationships.

As illustrated in FIG. 1, the implemented contactless system (CTS) consists of an energizing plate 10, an AC signal generator 11, suitable electromagnetic sensors 12, a sensor control unit 13, a sensitive measurement unit 14, a central computer workstation 15, and a board under test 16.

Figure 2:
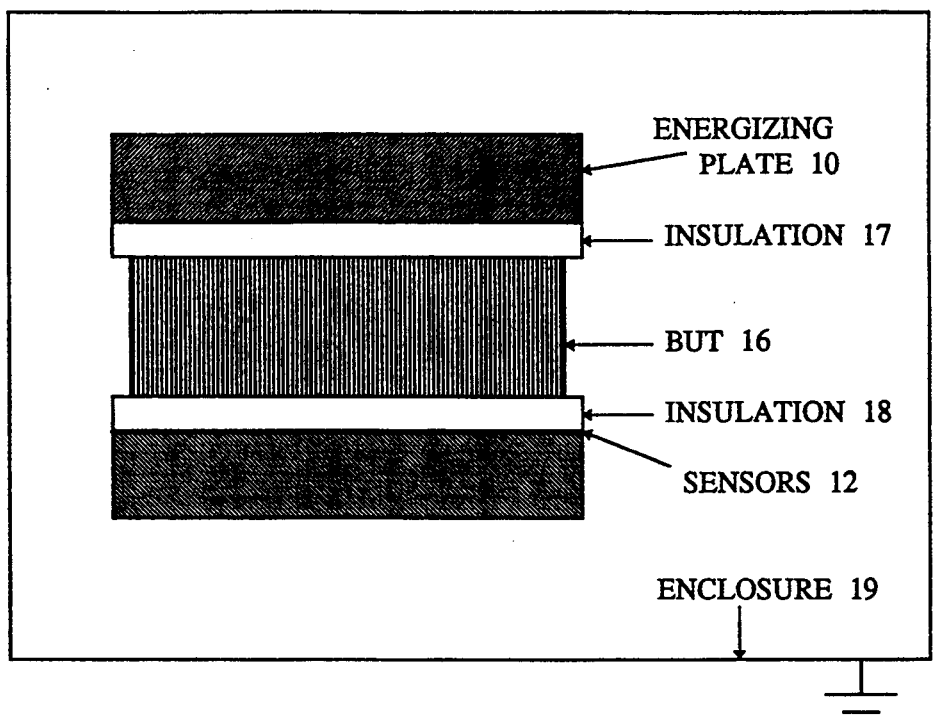
FIG. 2 is a schematic drawing showing the placement of the BUT in relation to the energizing plate and the sensor array within the metallic enclosure.

The energizing plate 10 is made of a high conducting metal material (aluminum or copper). It is connected to the AC signal generator 11. One side of the plate must have an insulation layer 17 (FIG. 2) to prevent electrical shorting with the BUT 16. The AC signal generator 11 generates a sinusoidal signal, at the sensor characteristic frequency, to the energizing plate which then emits an electromagnetic field to the BUT at the same frequency. The insulated side of the energizing plate is placed on top of the BUT. The electromagnetic field emitted from the energizing plate is thus guaranteed to be evenly distributed onto the whole BUT. The application of the field is also completely independent from the design layout of conducting elements on the BUT. No electrical contact with the BUT is required. Therefore, contactless testing for manufacturing faults by this method is valid for the whole board and is universally applicable to any type of board. The field perturbation by the BUT is solely a function of the design layout of the BUT. Therefore, the electromagnetic field signal detected by each sensor represents a pattern of the BUT at a particular XY coordinate where the sensor is located.

The board under test (BUT) in FIG. 1 is any type of unpopulated or inactive populated printed circuit board (inactive means the board is not electrically powered up). Because of the implemented energizing plate in the CTS, this test method is suitable for contactlessly testing for manufacturing faults and quality of the above mentioned boards, not suitable for testing the functionality of populated printed circuit boards.

Figure 3:
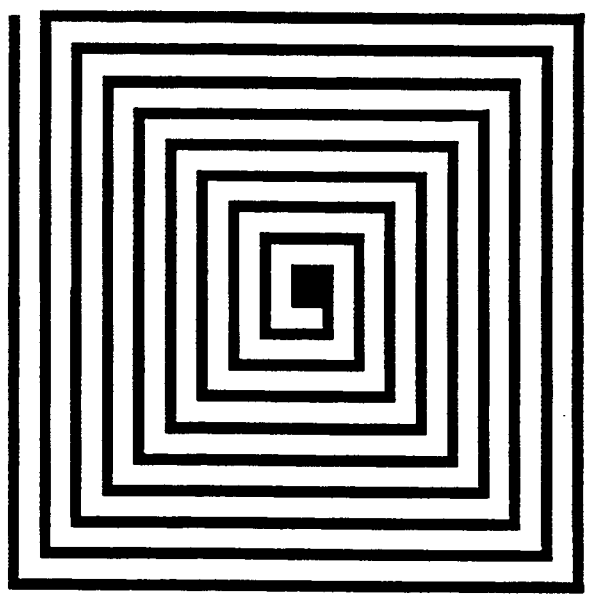
FIG. 3 is a top view (not to actual scale) of the topology of a planar sensor of the printed loop antenna type.

The electromagnetic sensors 12 can be in the form of a full size array covering the whole BUT or a smaller size array movable to scan the whole BUT. The switching and movement of sensors is controlled by the sensor control unit 13. The sensor is placed in close proximity to the other side (the side without the energizing plate) of the BUT. There must also be an insulation layer 18 (FIG. 2) between the sensor board and the BUT. The sensors are developed based on interrelations between current, charge, and electric and magnetic field intensities described by the Coloumb-Maxwell, Ampere-Maxwell and continuity equations. They are of the printed planar loop antenna type capable of measuring a wide range of signals up to 1 GHz in frequency range, and have a size of one half centimeter square. The top view topology (not to actual scale) is shown in FIG. 3. The loop end at the outside loop circle is connected to the ground of the whole system. The loop end at the center is the signal line (current) of the sensor.

The signal from each sensor is processed by the measurement unit 14 to produce a result of the peak value of the signal in a digital form. The resultant data from each sensor over all locations of the BUT constitutes a pattern (one scan) for the whole board. The fault recognition system in the computer 15 compares the pattern of the BUT with a known or desired pattern of an identical, non-faulty board to determine whether the BUT is faulty or not faulty. The known pattern of the non-faulty board can be obtained either by scanning a non-faulty board in the same way as scanning the BUT, or by theoretical calculation (refer to the attached paper) according to the design specification.

The sensor control unit 13 receives commands from the computer 15 to control the movement of sensors (sensor array) and switches individual sensors within the sensor array to the measurement unit 14. The measurement unit 14 can be a spectrum analyzer or other custom designed circuits capable of measuring peak values of the received signals and producing data in a digital form. The central computer workstation 15 controls the whole system by commanding the sensor control unit, receiving the measured results from the measurement unit, and running the fault recognition procedure. More detailed activities of the computer are shown in FIG. 4.

The energizing plate, the BUT and the sensor array are contained in a grounded metallic enclosure 19 in FIG. 3. The purpose of this enclosure is to provide a ground plane for the electromagnetic field inside and electromagnetic shielding for the interior content from external sources.

Figure 4:
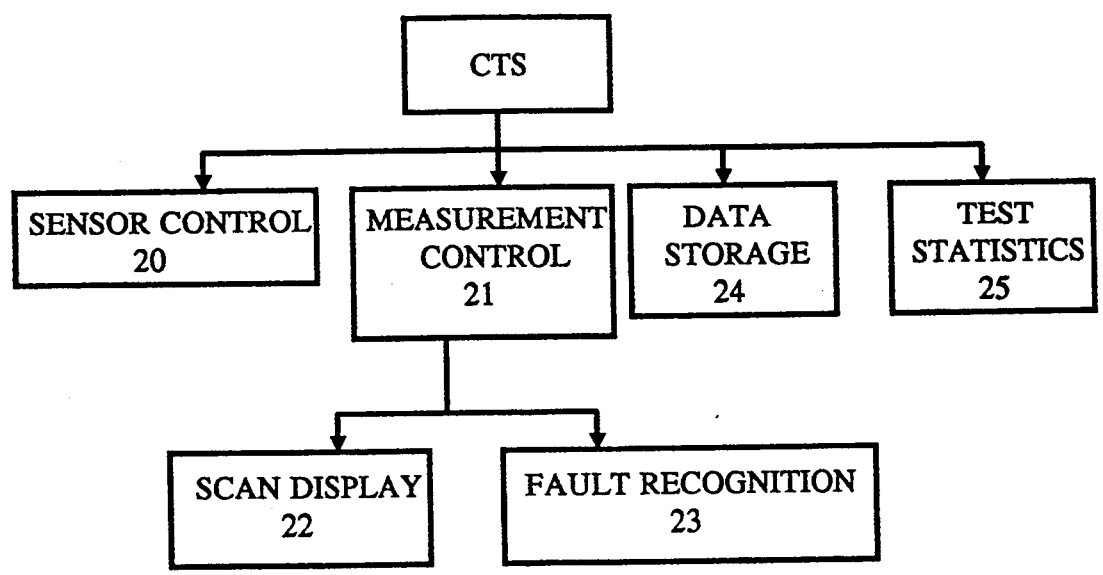
FIG. 4 is the software architecture of the CTS, illustrating software components of the implemented system.

FIG. 4 illustrates the software procedures required for the CTS. The sensor control procedure 20 controls the switching and movement of the senor array. Individual sensors in the array are switched to the measurement unit one at a time. Movement of the array may be required to cover more area of a BUT than a stationary array can cover. The measurement control procedure 21 instructs the measurement unit to receive the signal from each sensor and measure the peak value of the signal, and convert the analog value to a digital form. The resultant data from each sensor over all locations of the BUT constitutes a pattern (one scan) for the whole board. This pattern can be displayed on the computer screen as a plane image by the scan display procedure 22, or passed on to the fault recognition procedure 23. The fault recognition procedure 23 compares the pattern of the BUT with a known pattern of an identical, non-faulty board. Such a comparison results in a measure of the difference between the two boards. If the difference is larger than a predetermined threshold, the BUT is diagnosed to be faulty. If the difference is smaller than the threshold, the BUT is diagnosed to be not faulty. Further, regional comparisons can result in information on the actual location of the faults. The threshold used in the comparison can be determined by experiments before actual tests. The data storage procedure 24 stores and manages data from each test. The test statistics procedure 25 keeps track of the test result, time, types of boards, and calculates statistics of many tests.

Theoretical background for the solution of loop antennas and their derivatives results from integrating the Maxwell-Faraday equation over a loop area $S_a$ and applying Stokes Theorem thus obtaining $$\oint \vec{E} \cdot \vec{dl} = -j\omega\mu_0 \int \int S_a \vec{H} \cdot \vec{ds} \quad (1)$$

Consider a printed rectangular spiral antenna sensor whose top view is depicted in FIG. 3. The sensor is exposed to the reactive (or equivalently fringing) electric and magnetic near-fields surrounding the PCB. The portion of the near-field coinciding with the fringing field is commonly assumed to exist in the space confined at the distance $1/\kappa = \lambda/2\pi$ from an equivalent radiator. The sensor is placed inside a structure which consists of metallic planes of large dimensions. The distance between the planes is small as compared with the wavelength of the upper frequency limit of the applicator. The purpose of this structure is to provide the eddy current shielding of the interior of the applicator. The Green's function of structure is completely determined by this geometry of the contactless tester.

The fringing near-field performance of a single antenna sensor is of interest in response to the standard fields produced by the chosen radiators.

A printed loop antenna may be modeled as an uniformly impedance-loaded loop. The boundary conditions satisfied on the metallic surface S of the sensor are:

$$\vec{n} \times (\vec{E}^+ - \vec{E}^-) = 0 \quad (2)$$

and $$\vec{n} \times (\vec{H}^+ - \vec{H}^-) = Y_s \vec{E}_t \quad (3)$$

on the dielectric surface $S_d$. $Y_s$ is the surface admittance of the dielectric layer given by $$Y_S = j\omega(\epsilon - \epsilon_0)d \quad (4)$$

Where $\epsilon_0$ is the substrate permittivity while $\mu_0$ Equation (1) allows to find a general integral equation for the zero phase-sequence current by the use of the generalized Ohm's law $$j\omega\mu_0 \int S_a \nabla \times \int 31 G(\vec{X}, \vec{X}^1) \vec{K}(\vec{X}^1)$$
$$\cdot d\vec{S}^1 \vec{S}_a = \phi_L Z_l(\hat{l}) \vec{I}_o(\hat{l}) \cdot \vec{dl} - j\omega\mu_0 \phi_L \Phi_L$$
$$G(\vec{X}, \vec{X}^1) \vec{I}_o(\hat{l}^1) d\hat{l}^1 dL \quad (5)$$

The second term on the right hand side represents interaction due to reradiated field. The contour integral in (5) is defined for a single loop. Therefore in order to apply (5) to the printed spiral antenna, segmentation of a spiral into elementary loops is imposed. Then for each loop-segment equation (5) is valid. The continuity of current $\vec{I}_o$ is applied at the separation of each constitutive loop.

Equation (5) is not tractable yet for numerical solution due to the fact both $\vec{I}_o(\hat{l})$ and $\vec{K}(\vec{X})$ are unknown. The Lorentz reciprocity theorem applied to the fields inside the antenna gives second condition which leads to the integral equation:

$$\int_{S_d} \vec{E} \cdot Y_s \vec{E}_t dS + \int_{S_m} \vec{E} \cdot \vec{I}_o(\hat{l}) dS = \int V_o \vec{I}_o(\hat{l}) \cdot \vec{E} dv \quad (6)$$

where $\vec{E}$ is a function of current $\vec{K}$ ($\vec{Z}^1$) on the printed board. Equations (5) and (6) are coupled integral equations for the unknown currents. In order to solve the problem, it is natural to use the rectangular coordinate system because of the geometry in FIG. 3.

Having described the antenna characteristics, the signal received from the antenna must be processed to image the BUT's electromagnetic signature.

Denote a signal from each sensor as $s_{ij}(t)$ for $i=1,\ldots,N$ and $j=1,\ldots,M$, where t is the time variable, N and M are the size of the two dimensional sensor matrix. The pattern of $s_{ij}(t)$ is changed by changes in the signature of the PCB under test.

A signal from each sensor can also be represented in the frequency spectral domain. Denoting Fourier transform $$F_{ij}(\omega) = R_{ij}(\omega) + jX_{ij}(\omega) = A_{ij}(\omega)e^{\phi ij(\omega)}) = \int_\infty^\infty s_{ij}(t)e^{-j\omega t}dt \quad (7)$$

where $R_{ij}(\omega)$ and $X_{ij}(\omega)$ represent real and imaginary functions of the Fourier transform of signal $s_{ij}(t)$ which has a frequency spectrum given by $$A_{ij}(\omega) = \sqrt{R_{ij}^2(\omega) + X_{ij}^2(\omega)} \quad (8)$$

and $$\phi_{ij}(\omega) = \arctan \frac{X_{ij}(\omega)}{R_{ij}(\omega)} \quad (9)$$

In the spectral domain, imaging of the PCB under test (processing in the spatial domain) is obtained by integrating the spectra in some specific bandwidths. The result of integration for a single sensor is the pixel value (associated with a picture element). The pixel value is computed for bandwidths where $F_{ij}(\omega)$ possesses high signal-to-noise ratio.

Denoting by K the number of significant bandwidths, a signature image of a printed circuit board is defined for the k-th bandwidth in the following form $$I_k(ij) \stackrel{def}{=} \sum_{i=1}^{i=N} \sum_{j=1}^{j=M} \int_{\omega_{kL}}^{\omega_{kU}} A_{ij}^2(\omega)d\omega \quad (10)$$

where $I_k(ij)$ represents the power spectrum image in k-th frequently band $\omega_{kL}$ to $\omega_{kU}$. This power spectrum can be represented by the peak value of the signal if the signal is of a single frequency as implemented in the CTS described in this patent.

The phase angle $\phi(\omega)$ may also be used as a measure of pixel value in an image.

I claim:

1. A method for testing an unpopulated circuit board including electrically conductive paths, parts, and surfaces whose electrical and physical continuity and conformance to a known standard is to be verified, the method comprising providing a signal applying conductor; providing an array of non-contact sensors; placing an unpopulated circuit board under test between the signal applying conductor and the array such that the board under test is free from direct electrical contact with the signal applying conductor and with the array; powering the signal applying conductor by an AC electrical signal independent of geometric layout of the conductive material on the board under test to generate an original electromagnetic near field which is transmitted from the signal applying conductor to the array for detection thereby; using the said array of non-contact sensors, without direct electrical contact with the board under test, to detect a pattern of perturbation of the original electromagnetic near field of the signal applying conductor caused by the board under test, said pattern of perturbation therefore defining a test pattern representative of the circuit board under test; making a comparison of the said test pattern with a known pattern; and determining from the said comparison whether the board under test is in conformance to the known standard.

2. The method according to claim 1 wherein the signal applying conductor comprises a plate made of a high conducting metal material and wherein the plate is brought to a position closely adjacent one face of the circuit board under test to apply said electromagnetic near field to the board evenly over the face of the circuit board under test.

3. The method according to claim 2 including providing on the plate insulator means to prevent direct electrical contact with the board.

4. The method according to claim 3 wherein the insulator means comprises an insulating layer covering one face of the plate.

5. The method according to claim 1 wherein each sensor of the array comprises a planar printed spiral loop antenna.

6. The method according to claim 5 wherein the antenna has a transverse dimension of the order of 0.5 cm.

7. The method according to claim 1 including receiving a signal from each sensor and measuring the peak value of the signal, converting the analogue peak value to digital form and transferring the digital form to a central computer system.

8. A method for testing an inactive populated circuit board including electrically conductive paths, parts, and surfaces whose electrical and physical continuity and conformance to a known standard is to be verified, the method comprising providing a signal applying conductor; providing an array of non-contact sensors; placing an inactive populated circuit board under test between the signal applying conductor and the arrayarray such that the board under test is free from direct electrical contact with the signal applying conductor and with the array; powering the signal applying conductor by an AC electrical signal independent of geometric layout of the conductive material on the board under test to generate an original electromagnetic near field which is transmitted from the signal applying conductor to the array for detection thereby; using the said array of non-contact sensors, without direct electrical contact with the board under test, to detect a pattern of perturbation of the original electromagnetic near field of the signal applying conductor caused by the board under test, said pattern of perturbation therefore defining a test pattern representative of the circuit board under test; making a comparison of the said test pattern with a known pattern; and determining from the said comparison whether the board under test is in conformance to the known standard.

9. The method according to claim 8 wherein the signal applying conductor comprises a plate made of a high conducting metal material and wherein the plate is brought to a position closely adjacent one face of the circuit board under test to apply said electromagnetic near field to the board evenly over the face of the circuit board under test.

10. The method according to claim 9 including providing om the plate insulator means to prevent direct electrical contact with the board.

11. The method according to claim 10 wherein the insulator means comprises an insulating layer covering one face of the plate.

12. The method according to claim 8 wherein each sensor of the array comprises a planar printed spiral loop antenna.

13. The method according to claim 12 wherein the antenna has a transverse dimension of the order of 0.5 cm.

14. The method according to claim 8 including receiving a signal from each sensor and measuring the peak value of the signal, converting the analogue peak value to digital form and transferring the digital form to a central computer system.

* * * * *